United States Patent
Novák et al.

(10) Patent No.: US 10,580,194 B2
(45) Date of Patent: Mar. 3, 2020

(54) INFORMED CHOICES IN PRIMARY SAMPLE SPACE FOR LIGHT TRANSPORT SIMULATION

(71) Applicant: Disney Enterprises, Inc., Burbank, CA (US)

(72) Inventors: Jan Novák, Meilen (CH); Wenzel A. Jakob, Lausanne (CH); Wojciech Jarosz, Hanover, NH (US); Benedikt Martin Bitterli, West Lebanon, NH (US)

(73) Assignees: Disney Enterprises, Inc., Burbank, CA (US); ETH Zurich (Eidgenoessische Technische Hochschule Zurich), Zurich (CH)

( * ) Notice: Subject to any disclaimer, the term of this patent is extended or adjusted under 35 U.S.C. 154(b) by 7 days.

(21) Appl. No.: 15/808,658

(22) Filed: Nov. 9, 2017

(65) Prior Publication Data

US 2019/0139295 A1    May 9, 2019

(51) Int. Cl.
    *G06T 15/06*    (2011.01)
    *G06T 15/55*    (2011.01)
    *G06F 17/50*    (2006.01)

(52) U.S. Cl.
    CPC .............. *G06T 15/06* (2013.01); *G06F 17/50* (2013.01); *G06T 15/55* (2013.01)

(58) Field of Classification Search
    CPC .................................. G06T 15/06; G06T 15/55
    See application file for complete search history.

(56) References Cited

PUBLICATIONS

Jacopo Pantaleoni, "Charted Metropolis Light Transport", version 4 of manuscript submitted on arXiv system on Jan 30, 2017; https://arxiv.org/abs/1612.05395v4. (Year: 2017).*
NPL Video Titled "Introduction to Bayesian statistics, part 2: MCMC and the Metropolis Hastings algorithm", published Mar. 3, 2016; https://www.youtube.com/watch?v=OTO1DygELpY; select screenshots included. (Year: 2016).*
Jacopo Pantaleoni. 2017. Charted Metropolis Light Transport (SIGGRAPH '17). ACM.

(Continued)

*Primary Examiner* — Daniel F Hajnik
(74) *Attorney, Agent, or Firm* — Patterson + Sheridan, LLP

(57) ABSTRACT

Systems, methods and articles of manufacture for rendering three-dimensional virtual environments using reversible jumps are disclosed herein. In one embodiment, mappings from random numbers to light paths are modeled as an explicit iterative random walk. Inverses of path construction techniques are employed to turn light transport paths back into the random numbers that produced them. In particular, such inverses may be used to extend the Multiplexed Metropolis Light Transport (MMLT) technique to perform path-invariant perturbations that produce a new path sample using a different path construction technique but preserve the path's geometry. To render an image, a rendering application in one embodiment may trace light paths through a virtual scene, with some path samples being generated by probabilistically selecting one or more techniques through technique perturbation and using inverses of the selected technique(s) to invert existing path(s), and with new paths being obtained by mutating or perturbing existing paths.

18 Claims, 6 Drawing Sheets

(56) References Cited

PUBLICATIONS

Geyer, C. J. 2011. Introduction to Markov Chain Monte Carlo. In Handbook of Markov Chain Monte Carlo. Chap-man and Hall CRC, ch. 1, 3-47.

Hachisuka, T., and Jensen, H. W. 2011. Robust adaptive photon tracing using photon path visibility. ACM Trans. Graph. 30, 5 (Oct), 114:1-114:11. [Abstract Only].

Hachisuka, T., Pantaleoni, J., and Jensen, H. W. 2012. A path space extension for robust light transport simulation. ACM Trans. Graph. 31, 6 (Nov.), 191:1-191:10. [Abstract Only].

Hachisuka, T., Kaplanyan, A. S., and Dachsbacher, C. 2014. Multiplexed Metropolis light transport. ACM Trans. Graph. 33, 4 (July), 100:1-100:10. [Abstract Only].

Hanika, J., Kaplanyan, A., and Dachsbacher, C. 2015. Improved half vector space light transport. Computer Graphics Forum (Proceedings of Eurographics Symposium on Rendering) 34, 4 (June), 65-74. [Abstract Only].

Kaplanyan, A. S., Hanika, J., and Dachsbacher, C.2014. The natural-constraint representation of the path space for effcient light transport simulation. ACM Trans-actions on Graphics (Proc. SIGGRAPH) 33, 4. [Abstract Only].

Kelemen, C., Szirmay-Kalos, L, Antal, G., and Csonka, F. 2002. A simple and robust mutation strategy for the Metropolis light transport algorithm. In Computer Graphics Forum, 531-540. [Abstract Only].

Marinari, E., and Parisi, G. 1992. Simulated tempering: A new Monte Carlo scheme. Europhysics Letters, 19, 451{ 458. [Abstract Only].

Qin, H., Sun, X., Hou, Q., Guo, B., and Zhou, K. 2015. Unbiased photon gathering for light transport simulation. ACM Trans. Graph. 34, 6 (Oct.), 208:1-208:14. [Abstract Only].

Swendsen, R. H., and Wang, J.-S. 1986. Replica Monte Carlo simulation of spin-glasses. Phys. Rev. Lett., 57, 2607-2609.

Tierney, L. 1994. Markov chains for exploring posterior distributions. Annals of Statistics 22 , 1701-1762.

Veach, E., and Guibas, L. J. 1997. Metropolis light transport. In Proceedings of the 24th Annual Confer-ence on Computer Graphics and Interactive Techniques, ACM Press/Addison-Wesley Publishing Co., New York, NY, USA, SIGGRAPH '97, 65-76.

Veach, E. 1997. Robust Monte Carlo Methods for Light Transport Simulation. PhD thesis, Stanford University.

Sik, M., Otsu, H., Hachisuka, T., and Krivanek, J. 2016. Robust light transport simulation via Metropolised bidirectional estimators. ACM Trans. Graph. 35, 6 (Nov.), 245:1-245:12. [Abstract Only].

Wilkie, A., Nawaz, S., Droske, M., Weidlich, A., and Hanika, J. 2014. Hero wavelength spectral sampling. In Proceedings of the 25th Eurographics Symposium on Ren-dering, Eurographics Association, Aire-la-Ville, Switzerland, Switzerland, EGSR '14, 123-131. [Abstract Only].

James Arvo and David Kirk. Particle transport and image synthesis. In Proceedings of the 17th Annual Conference on Computer Graphics and Interactive Techniques, SIGGRAPH '90, pp. 63-66, New York, NY, USA, 1990. ACM.

Benedikt Bitterli. Tungsten renderer, 2014. https://github.com/tunabrain/tungsten. [Accessed Online Oct. 16, 2017].

G. E P. Box and Mervin E. Muller. A note on the generation of random normal deviates. The Annals of Mathematical Statistics, 29(2):610-611, 06 1958.

Radu V. Craiu and Christiane Lemieux. Acceleration of the multiple-try metropolis algorithm using antithetic and stratified sampling. Statistics and Computing, 17(2):109-120, 2007.

Robert L. Cook, Thomas Porter, and Loren Carpenter. Distributed ray tracing. In Proceedings of the 11th Annual Conference on Computer Graphics and Interactive Techniques, SIGGRAPH '84, pp. 137-145, New York, NY, USA, 1984. ACM.

David Cline, Justin Talbot, and Parris Egbert. Energy redistribution path tracing. ACM Trans. Graph., 24(3):1186-1195, Jul. 2005. [Abstract Only].

Paul Debevec. Rendering synthetic objects into real scenes: Bridging traditional and image-based graphics with global illumination and high dynamic range photography. In Annual Conference Series (Proc. SIGGRAPH), pp. 189-198, 1998.

Philip Dutr'e, Paul Heckbert, Vincent Ma, Fabio Pellacini, Robert Porschka, Mahesh Ramasubramanian, Cyril Soler, and Greg Ward. Global illumination compendium, 2001.

Christian Eisenacher, Gregory Nichols, Andrew Selle, and Brent Burley. Sorted deferred shading for production path tracing. In Proceedings of the Eurographics Symposium on Rendering, EGSR '13, pp. 125-132, Aire-la-Ville, Switzerland, Switzerland, 2013. Eurographics Association. [Abstract Only].

Manfred Ernst, Marc Stamminger, and Gunther Greiner. Filter importance sampling. In IEEE Symposium on Interactive Ray Tracing 2006, pp. 125-132, Sep. 2006. [Abstract Only].

Iliyan Georgiev, Jaroslav Krivanek, Toshiya Hachisuka, Derek Nowrouzezahrai, and Wojciech Jarosz. Joint importance sampling of low-order volumetric scattering. ACM Transactions on Graphics (Proceedings of SIGGRAPH Asia), 32(6), Nov. 2013.

Cindy M. Goral, Kenneth E. Torrance, Donald P. Greenberg, and Bennett Battaile. Modeling the interaction of light between diffuse surfaces. SIGGRAPH Comput. Graph., 18(3):213-222, Jan. 1984.

W.K .Hastings. Monte carlo sampling methods using markov chains and their applications. Biometrika, 57(1):97-109, 1970. [Abstract Only].

Jared Hoberock and John C. Hart. Arbitrary importance functions for metropolis light transport. In Computer Graphics Forum, pp. 1993-2003, 2010.

Illumination Engineering Society of North America. IES standard file format for electronic transfer of photometric data and related information, 1991.

Wenzel Jakob. Mitsuba renderer, 2010. http://www.mitsubarenderer.org. [Accessed Online Oct. 16, 2017].

Wojciech Jarosz. Efficient Monte Carlo Methods for Light Transport in Scattering Media. PhD thesis, UC San Diego, Sep. 2008. [Abstract Only].

James T. Kajiya. The rendering equation. In Proceedings of the 13th Annual Conference on Computer Graphics and Interactive Techniques, SIGGRAPH '86, pp. 143-150, New York, NY, USA, 1986. ACM.

Samuli Laine, Tero Karras, and Timo Aila. Megakernels considered harmful: Wavefront path tracing on gpus. In Proceedings of the 5th High-Performance Graphics Conference, HPG '13, pp. 137-143, New York, NY, USA, 2013. ACM.

Jun S. Liu, Faming Liang, and Wing H. Wong. The multiple-try method and local optimization in metropolis sampling. Journal of the American Statistical Association, 95(449):121+, Mar. 2000.

Eric P. Lafortune and Yves D. Willems. Bi-directional path tracing. In Proceedings of 3rd International Conference on Computational Graphics and Visualization Techniques COMPUGRAPHICS '93, pp. 145-153, 1993. [Abstract Only].

Eric P. Lafortune and Yves D. Willems. Rendering participating media with bidirectional path tracing. In Proceedings of the Eurographics Workshop on Rendering Techniques '96, pp. 91-100, London, UK, UK, 1996. Springer-Verlag.

Nicholas Metropolis, Arianna W. Rosenbluth, Marshall N. Rosenbluth, Augusta H. Teller, and Edward Teller. Equation of state calculations by fast computing machines. The Journal of Chemical Physics, 21(6):1087-1092, 1953.

F. Nicodemus, J. Richmond, J. Hsia, I. Ginsberg, and T. Limperis. Geometric considerations and nomenclature for reflectance. Monograph 160, National Bureau of Standards (US), Oct. 1977.

Matt Pharr and Greg Humphreys. Physically Based Rendering, Second Edition: From Theory to Implementation. Morgan Kaufmann Publishers Inc., San Francisco, CA, USA, 2nd edition, 2010.

Bui Tuong Phong. Illumination for computer generated pictures. Commun. ACM, 18(6):311-317, Jun. 1975.

Benjamin Segovia, Jean-Claude Iehl, and Bernard Proche. Coherent metropolis light transport with multiple-try mutations. Technical report, LIRIS UMR 5205 CNRS/INSA de Lyon/Universit Claude Bernard Lyon 1/Universit Lumire Lyon 2/cole Centrale de Lyon, Apr. 2007.

(56) References Cited

PUBLICATIONS

Eric Veach. Non-symmetric scattering in light transport algorithms. In Proceedings of the EurographicsWorkshop on Rendering Techniques '96, pp. 81-90, London, UK, UK, 1996. Springer-Verlag. [Abstract Only].

Eric Veach and Leonidas J. Guibas. Optimally combining sampling techniques for monte carlo rendering. In Proceedings of the 22nd Annual Conference on Computer Graphics and Interactive Techniques, SIGGRAPH '95, pp. 419-428, New York, NY, USA, 1995. ACM.

Eric Veach and Leonidas J. Guibas. Metropolis light transport. In Proceedings of the 24th Annual Conference on Computer Graphics and Interactive Techniques, SIGGRAPH '97, pp. 65-76, New York, NY, USA, 1997. ACM Press/Addison-Wesley Publishing Co.

Turner Whitted. An improved illumination model for shaded display. Commun. ACM, 23(6)343-349, Jun. 1980.

E. Woodcock, T. Murphy, P. Hemmings, and L. T.C . Techniques used in the GEM code for monte carlo neutronics calculations in reactors and other systems of complex geometry. In Proceedings of the Conference on Applications of Computing Methods to Reactor Problems, 1965.

Bruce Walter, Stephen R. Marschner, Hongsong Li, and Kenneth E. Torrance. Microfacet models for refraction through rough surfaces. In Proceedings of the 18th Eurographics Conference on Rendering Techniques, EGSR '07, pp. 195-206, Aire-la-Ville, Switzerland, Switzerland, 2007. Eurographics Association.

Wenzel Jakob, Wojciech Jarosz, Jan Novak, Overseen by Markus Gross, "Informed Choices in Primary Sample Space," Master Thesis, Aug. 2015, 98 pages.

Benedikt Bitterli, Wenzel Jakob, Jan Novak and Wojciech Jarosz, "Reversible Jump Metropolis Light Transport using Inverse Mappings," ACM Transactions on Graphics, vol. 1, No. 1, Article 1, Publication date: Jan. 2017, 11 pages.

Peter J. Green. 1995. Reversible Jump Markov Chain Monte Carlo Computation and Bayesian Model Determination. Biometrika 82 (1995), 711-732.

Adrien Gruson, Mickaël Ribardière, Martin Šik, Jirí Vorba, Rémi Cozot, Kadi Bouatouch, and Jaroslav Krivánek. 2017. A Spatial Target Function for Metropolis Photon Tracing. ACM Trans. Graph. 36, 1, Article 4 (Feb. 2017), 13 pages. https://doi.org/10. 1145/2963097.

Shinya Kitaoka, Yoshifumi Kitamura, and Fumio Kishino. 2009. Replica Exchange Light Transport. Computer Graphics Forum 28, 8 (Dec. 2009), 2330-2342. https: //doi.org/10.1111/j.1467-8659. 2009.01540. [Abstract Only].

Jaakko Lehtinen, Tero Karras, Samuli Laine, Miika Aittala, Frédo Durand, and Timo Aila. 2013. Gradient-Domain Metropolis Light Transport. ACM Transactions on Graphics (Proceedings of SIGGRAPH) 32, 4, Article 95 (Jul. 2013), 12 pages. https: //doi.org/10.1145/2461912.2461943 [Abstract Only].

Tzu-Mao Li, Jaakko Lehtinen, Ravi Ramamoorthi,Wenzel Jakob, and Frédo Durand. 2015. Anisotropic Gaussian Mutations for Metropolis Light Transport Through Hessian- Hamiltonian Dynamics. ACM Transactions on Graphics (Proceedings of SIGGRAPH Asia) 34, 6, Article 209 (Oct. 2015), 13 pages. https://doi.org/10.1145/2816795.2818084 [Abstract Onlly].

E. Woodcock, T. Murphy, P. Hemmings, and T. Longworth. 1965. Techniques used in the GEM Code for Monte Carlo Neutronics Calculations in Reactors and other Systems of Complex Geometry. In Proceedings of the Conference on Applications of Computing Methods to Reactor Problems. 557-579.

Hisanari Otsu, Anton S. Kaplanyan, Johannes Hanika, Carsten Dachsbacher and Toshiya Hachisuka, "Fusing State Spaces for Markov Chain Monte Carlo Rendering," ACM Transactions on Graphics, vol. 36, No. 4, Article 74, Publication date, Jul. 2017, 10 pages.

Wenzel Jakob. Light Transport on Path-Space Manifolds. PhD thesis, Cornell University, Aug. 2013. [Abstract Only].

James Arvo. 1986. Backward Ray Tracing. In Developments in Ray Tracing, ACM SIGGRAPH Course Notes, 8 pages.

Iliyan Georgiev, Jaroslav Křivánek, Tomáš Davidovič, and Philipp Slusallek. 2012. Light Transport Simulation with Vertex Connection and Merging. ACM Transactions on Graphics (Proc. SIGGRAPH Asia) 31, 6 (2012), 192:1-192:10.

Toshiya Hachisuka, Shinji Ogaki, and Henrik Wann Jensen. 2008. Progressive Photon Mapping. ACM Transactions on Graphics (Proc. SIGGRAPH Asia) 27,5 (2008), 130.

Wenzel Jakob and Stephen Marschner. 2012. Manifold Exploration: A Markov Chain Monte Carlo Technique for Rendering Scenes with Difficult Specular Transport. ACM Transactions on Graphics (Proc. SIGGRAPH) 31,4, Article 58 (2012).

Henrik Wann Jensen. 1996. Global Illumination Using Photon Maps. In Proc. Eurographics Workshop on Rendering. 21-30.

Joel Kronander, Thomas B. Schön, and Jonas Unger. 2015. Pseudo-Marginal Metropolis Light Transport. In SIGGRAPH Asia 2015 Technical Briefs. 13:1-13:4.

Thomas Malley. 1988. A Shading Method for Computer Generated Images. Master's thesis. University of Utah. [Abstract Only].

Peter Shirley, Bretton Wade, Philip M. Hubbard, David Zareski, Bruce Walter, and Donald P. Greenberg. 1995. Global Illumination via Density-Estimation. In Rendering Techniques 1995 (Proceedings of the Eurographics Workshop on Rendering). 219-230.

Eric Veach and Leonidas Guibas. 1994. Bidirectional Estimators for Light Transport. In Proc. Eurographics Workshop on Rendering. 147-162. [Abstract Only].

Heitz, E., and D'Eon, E. 2014. Importance Sampling Microfacet-Based BSDFs using the Distribution of Visible Normals. Computer Graphics Forum 33, 4 (July), 103-112.

\* cited by examiner

INFORMED CHOICES IN PRIMARY SAMPLE SPACE FOR LIGHT TRANSPORT SIMULATION

BACKGROUND

Field

This disclosure provides techniques for rendering images of scenes including three-dimensional virtual geometry.

Description of the Related Art

Rendering is the automated process of generating photorealistic or nonphotorealistic images from two or three-dimensional models. Monte Carlo rendering techniques have been used to simulate light propagation by sampling random paths connecting a light source and a virtual sensor. In scenes with complex materials, geometry, or lighting, the space of light paths can be large and high-dimensional, while the subset of paths contributing significantly to the rendered image may occupy only a narrow subspace. This can make Monte Carlo rendering a difficult sampling problem.

In contrast to traditional Monte Carlo rendering techniques, Markov Chain Monte Carlo (MCMC) rendering techniques, such as Metropolis Light Transport (MLT), generate a statistically dependent sequence of samples (light paths) with a density proportional to a non-negative function, typically using the Metropolis-Hastings steps, drawing a proposal state from a proposal distribution which is accepted with a certain probability to become the next state of the Markov Chain (with the process repeating anew if the proposal is not accepted). Primary Sample Space MLT (PSSMLT) retrofits such Metropolis sampling to traditional Monte Carlo techniques by treating them as abstract path samplers and perturbing the random numbers they consume. Multiplexed MLT (MMLT) further allows the Markov Chain to adaptively select the bidirectional sampling techniques that have high contribution. However, operating in the space of random numbers can make these techniques less successful at locally exploring important regions of the state space. For example, since most sampling schemes construct paths incrementally, a PSSMLT change in the random numbers used by one vertex on the path generally leads to a ripple change that changes the path geometry by affecting all subsequent vertices, and the changing of sampling techniques in MMLT means the random numbers are reinterpreted as input to a different technique, producing an entirely different path. Such changes in the path geometry can in turn lead to increased amounts of noise and undesirable noise distributions in rendered images, among other things.

SUMMARY

One embodiment of this disclosure provides a computer-implemented method for rendering an image of a virtual scene. The method generally includes generating a first path sample using a first path construction technique and a first sample-space vector. The method further includes probabilistically selecting a second path construction technique from a plurality of path construction techniques. The method also includes generating a second path sample, wherein generating the second path sample includes determining, using an inverse of the second path construction technique, a second sample-space vector corresponding to the first path sample. In addition, the method includes adding a contribution of the second path sample to the image of the virtual scene.

Other embodiments include, without limitation, a computer-readable medium that includes instructions that enable a processing unit to implement one or more embodiments of the disclosed method, as well as a system configured to implement one or more aspects of the disclosed method.

BRIEF DESCRIPTION OF THE DRAWINGS

So that the manner in which the above recited aspects are attained and can be understood in detail, a more particular description of embodiments of the invention, briefly summarized above, may be had by reference to the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
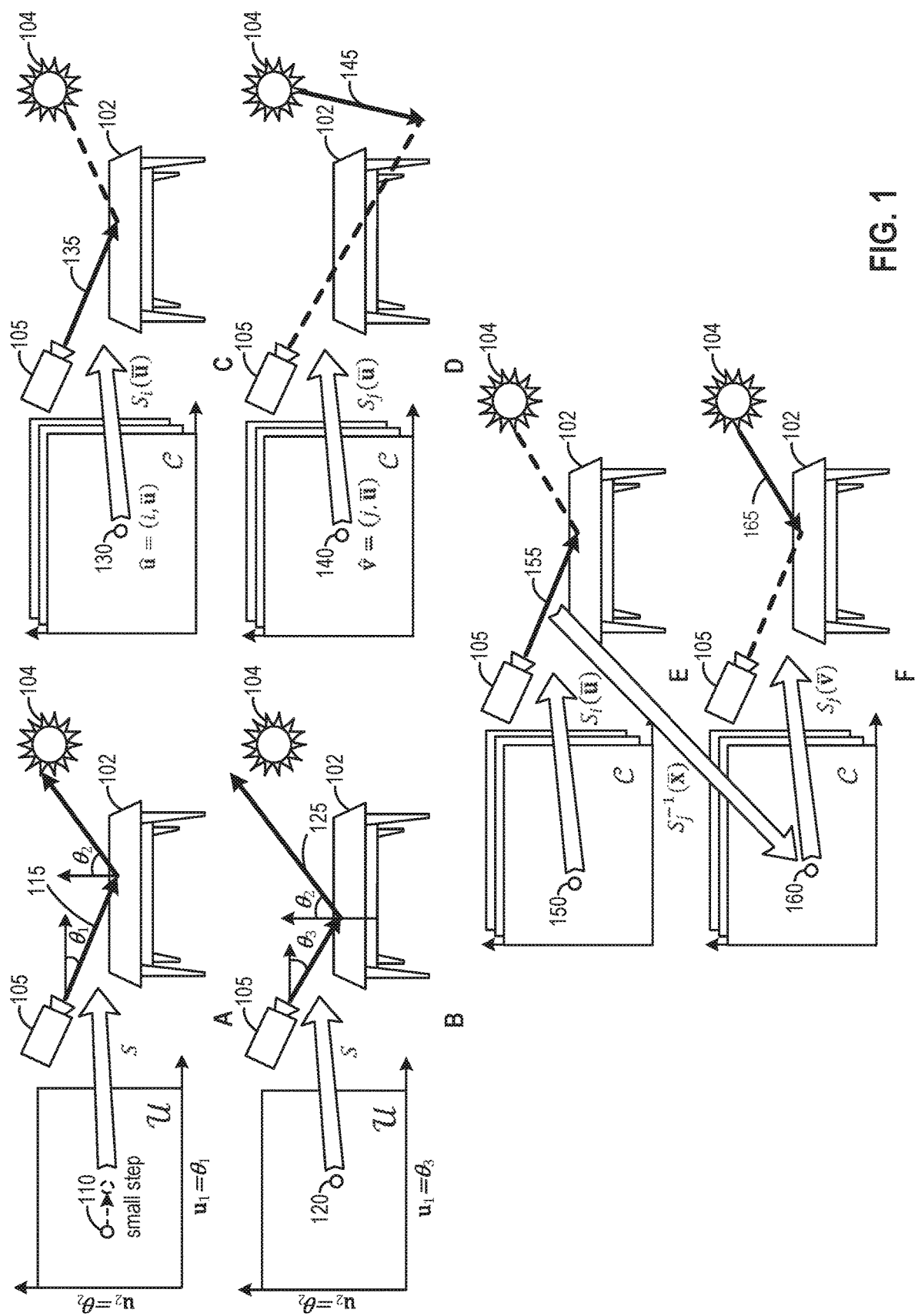
FIG. 1 illustrates issues with path sampling using existing rendering techniques and an approach to solve such issues, according to an embodiment.

Embodiments presented herein provide techniques for rendering three-dimensional (3D) virtual environments using reversible jumps. In one embodiment, mappings from random numbers to light paths are modeled as an explicit iterative random walk. Inverses of path construction techniques are employed to robustly turn light transport paths back into the random numbers that produced them. A path construction technique, also referred to herein as a "path sampling technique" or "sampling technique," uses a path sampling function to map points in a space of random numbers, referred to as the primary sample space, to a path space, thereby generating a light path, also referred to as the path sample. As discussed, one embodiment turns such a path that has been constructed using one technique back into a random sample space vector using an inverse of the other technique. Doing so permits operations such as moving an arbitrary number of vertices from one path to another, and complex and error-prone computations that arise from directly operating on paths are avoided by operating instead on the random numbers that produce paths. One embodiment uses the inverses of path construction techniques to extend Multiplexed Metropolis Light Transport (MMLT) to perform path-invariant perturbations that produce a new path sample using a different path construction technique but preserving the path's geometry (i.e., the order and locations of vertices), thereby increasing acceptance rate and efficiency of the technique. Unlike traditional perturbations in techniques such as MMLT, the perturbation of path construction techniques in embodiments disclosed herein are fully deterministic (rather than probabilistic) aside from selecting one of a number of available inverses or a probabilistic inverse in the case of non-invertible path construction techniques. In particular, to render an image, a rendering application in one embodiment may trace light paths through a virtual scene, with some path samples being generated by probabilistically selecting one or more techniques through technique perturbation and using inverses of the selected technique(s) to invert existing path(s), and with new paths being obtained by mutating or perturbing existing paths.

Herein, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access applications (e.g., a rendering application) or related data available in the cloud. For example, a rendering application could execute on a computing system in the cloud and perform image rendering disclosed herein. Doing so allows a user to access this information from any computing system attached to a network connected to the cloud (e.g., the Internet).

FIG. 1 illustrates issues with path sampling using existing rendering techniques and an approach to solve such issues, according to an embodiment. Panels A-B show an issue that a pure perturbation strategy, which is used in some rendering techniques such as Primary Sample Space Metropolis Light Transport (PSSMLT), can have. As shown, a scene which includes a table 102 and a light source 104 is rendered via path tracing. In general, path tracing techniques work by tracing paths into a virtual scene from a camera to simulate the propagation of light. Starting from the virtual camera 105, a rendering application may sample a position in the image being rendered, shoot a ray into the virtual scene, find a nearest surface point (e.g., a point on the table 102) that is visible to the camera, reflect the light ray off the surface, and extend the light ray into scene, etc., until the light ray intersects a source of illumination (e.g., light source 104) such as a virtual light bulb or sun. In contrast to path tracing, light tracing rendering techniques build light paths from light sources and bounce the light off of objects in the virtual scene until the light paths intersect the camera. Some rendering techniques such as bidirectional variants of path tracing (BDPT) use both path and light tracing that construct partial paths from the virtual camera and the light source, respectively, and combine such partial paths (e.g., at the table 102). Illustratively, PSSMLT in particular first selects a path 115 by sampling a primary sampling space $\mathcal{U}$ to obtain a random number vector 110, which includes the angles $\theta_1$ and $\theta_2$ indicating the directions of the path, that is mapped to the path 115 using a path construction technique. To locally explore the state space, rendering techniques such as PSSMLT further perturb sampled random numbers, such as the random number vector 110, by small steps (e.g., by offsetting one or more of the random numbers in the vector a little with another random number) to obtain other sample points, such as random number vector 120 which changes the path 115 slightly to a new path 125. However, as shown in panel B, such a perturbation may cause a ripple change that propagates to later vertices and causes an undesirable large-scale change of the vertex on the light source 104. For example, the new path 125 shown in panel B no longer hits the light source 104. That is, by modeling mappings between random number vectors to light paths as opaque functions, rendering techniques such as PSSMLT do not account for how they interfere with the sampling process.

In order to overcome the issue illustrated in panels A-B, some rendering techniques such as Multiplexed MLT (MMLT) may switch to a different sampling technique, for instance a light tracing technique that samples a position on the light source 104, rather than relying on a path to intersect the light source 104 by chance. As shown in panels C-D, the sampling in MMLT uses a multiplexed primary sample space and samples both a path construction technique (e.g., the techniques denoted by i and j) and a random number vector (e.g., the random number vectors denoted by $\bar{u}$ and $\bar{v}$), with the path being constructed using that path construction technique and random number vector. Illustratively, the multiplexed state $\hat{u}=(i, \bar{u})$ is mapped to a path tracing path 135 that begins at the camera 105, while the multiplexed state $\hat{v}=(j,\bar{u})$ is mapped to a light tracing path 145 that begins at the light source 104. Partial light paths such as the paths 135 and 145 from the camera 105 and from the light source 104, respectively, may then be connected together, as in BDPT. However, as shown in Panel D, changing path construction techniques may lead to an undesirable large-scale change in the light path, such as the light path 145 that no longer intersects with the table 102, and such proposed paths may end up being rejected with high probability. That is, the same random number vector may result in a different path geometry if a technique is selected that constructs the path using the random number vector in a different manner.

The issues discussed above with respect to panels A-D can turn small perturbations of random numbers into large, disruptive changes in the path. This may in turn inhibit the ability of the Markov Chain to explore the state space locally and increases the likelihood of the chain getting "stuck" in small parts of the state space, exacerbating structured artifacts and temporal instability.

As shown in panels E-F, one embodiment employs a technique, referred to herein as reversible jump MLT (RJMLT), that permits an efficient path construction technique perturbation while leaving the path geometry intact and always accepting a proposed switch in path construction techniques. The goal of such a technique perturbation is to create a new path sample that preserves the geometry of the previous path but pretends that it is created with a new path construction technique. In one embodiment, each of the path construction techniques is a different bidirectional path sampling technique that may construct the same path using a different number of steps on the camera and light paths (e.g., using light tracing instead of path tracing). When the path construction technique is changed from technique i to technique j, the geometry of the path is preserved from the original path (e.g., path 155) to the new path (e.g., path 165), with the new path being constructed by (1) applying an inverse transform $S_j^{-1}$ of path construction technique j to take the original path back to a point 160 in sample space, and (2) confirming that the new technique j can construct the original path's geometry, as discussed in greater detail below. It should be understood that, just as the perturbation of random number vectors in PSSMLT may result in a smaller change than creating a new random number vector, switching techniques while preserving the same path geometry is an even smaller change that may reduce variance (noise) in the rendered image, thereby improving efficiency and resulting in a higher-quality image.

More formally, physically based rendering techniques can be expressed as approximations to a measurement equation which considers integrals of the form:

$$I_j = \int_\mathcal{P} h_j(\bar{x}) f(\bar{x}) d\mu(\bar{x}). \tag{1}$$

Equation (1) computes the value of a measurement $I_j$ (usually, a pixel) in terms of an integral over all possible light paths. The integrand is composed of the pixel reconstruction filter $h_j(\bar{x})$ and the contribution $f(\bar{x})$ of light path $\bar{x}$ (here, the bar notation indicates quantities organized as multiple vertices). The domain of all such light paths is the path space $\mathcal{P}$, which can also be decomposed further into subdomains $\mathcal{P}^k$ that contain only light paths of a fixed length k and which together form $\mathcal{P} = \cup_{k=2}^{\infty} \mathcal{P}^k$.

Traditional Monte Carlo rendering techniques approximate equation (1) using the estimator:

$$I_j = \frac{1}{N} \sum_{i=1}^{N} \frac{h_j(\bar{x}^{(i)}) f(\bar{x}^{(i)})}{p(\bar{x}^{(i)})}, \quad (2)$$

which averages N independently sampled light paths $\bar{x}^{(i)}$, where $p(\bar{x}^{(i)})$ is the probability density of the i-th path sample. Such probability densities directly determine the variance of the estimator. Bidirectional variants of path tracing have also been used, building on the reciprocal nature of light transport to construct partial light paths from both the camera and from light sources, and then connecting such partial paths with each other to yield large families of sampling techniques. Aside from traditional Monte Carlo rendering, Markov Chain Monte Carlo (MCMC) rendering techniques such as MLT have also been employed. MCMC rendering techniques use local exploration to generate a correlated sequence of samples (light paths) with a density proportional to an arbitrary non-negative function C(x), typically using the Metropolis-Hastings steps: given current state x, a proposal state y is drawn from a proposal distribution T(x→y) and is accepted to become the next state of the Markov Chain with probability $$r(x \to y) = \min\left\{1, \frac{C(y)T(y \to x)}{C(x)T(x \to y)}\right\};$$

otherwise, the proposal state is rejected and the process repeats anew. PSSMLT in particular is a type of MCMC rendering technique based on the observation that each iteration of a classical Monte Carlo rendering technique consumes a limited number of random variates and uses them to sample light path(s). This sampling process can be expressed in terms of an abstract sampling technique $S(\bar{u})$, which takes a vector $\bar{u}$ of random numbers drawn uniformly and generates a light path, with the domain of these vectors forming the primary sample space $\mathcal{U}$ that can be decomposed over path lengths such as $\mathcal{U} = \cup_{k=1}^{\infty} \mathcal{U}^k$ and $\mathcal{U} = [0, 1]\mathcal{O}^k$, where the dimensionality $\mathcal{O}_k$ is chosen to be large enough such that all light paths of length k can be sampled by S. This allows equation (2) to be rewritten in terms of sampling technique using the relation $x_i = S(u_i)$. That is, PSSMLT operates a Markov Chain in the primary sample space $\mathcal{U}$ rather than the path space $\mathcal{P}$ and relies on the underlying rendering technique to convert such samples into light paths using the sampling technique at its disposal. The target function $C(\bar{u})$ then becomes the composition of the path contribution and sampling technique, $$C(\bar{u}) = (f \circ S)(\bar{u})/p(\bar{u}). \quad (3)$$

PSSMLT is often combined with BDPT which use k+2 different sampling techniques $S_0(\bar{u}), \ldots, S_{k+1}(\bar{u})$ to construct paths of length k from shorter eye/camera subpaths. In such cases, PSSMLT may evaluate equation (3) by generating two subpaths and determining the multiple importance sampling (MIS)-weighted contribution for all pairs of vertices, which can be computationally expensive with many vertex pairs contributing little to no energy. MIS is a technique for reweighting samples that can provably reduce variance if multiple techniques can be used to generate a sample. MMLT addresses the problem with PSSMLT being computationally expensive by informing the Markov Chain about the availability of multiple sampling techniques. In particular, MMLT runs separate Markov Chains for each path length k, in which the first dimension of the primary sample space is used to select one of the k+2 techniques of BDPT. As a result, a perturbation in MMLT may change both the vector of random numbers as well as the sampling technique used to map that vector into a light path. Each Markov Chain in MMLT uses the modified target function $$C_j(\bar{u}) = w_j(\bar{u})(f \circ S_j)(\bar{u})/p_j(\bar{u}), \quad (4)$$

which incorporates the MIS weight $w_j(\bar{u})$ of the technique. Instead of evaluating all sampling techniques all the time, the choice of sampling technique is adaptively made by the underlying Metropolis-Hastings iteration, allowing MMLT to focus computation on successful sampling techniques that carry significant energy from the light sources to the camera. However, like PSSMLT, MMLT suffers from structured artifacts and temporal instability, as sampling technique changes and small steps in primary sample space $\mathcal{U}$ can lead to large, disruptive changes to the resulting light path, inhibiting the Markov Chain's ability to locally explore state space. These issues are shown, and described above with respect to, panels A-D of FIG. 1.

As discussed, one embodiment employs a RJMLT technique that permits efficient sampling technique perturbation by leaving the path geometry intact during such perturbation. RJMLT is a reformulation of the MMLT technique, but with perturbations that change sampling techniques in terms of deterministic mappings between sample spaces, and with inverses being leveraged to reliably transition between sampling techniques. In RJMLT, the choice of sampling technique is explicitly separated from the rest of the primary sample space. The Markov Chain then operates in the product of a discrete and continuous space, $C^k = \{0, \ldots, k+1\} \times \mathcal{U}^k$ referred to herein as the multiplexed primary sample space, which is decomposed into subspaces $\cup_{i=0}^{k+1} C_i^k$ and $C_i^k = \{i\} \times [0,1] \mathcal{O}^k$ of the i-th sampling technique for paths of length k. In contrast to the perturbations proposed in MMLT that always perturb the position in primary sample space and may additionally change the path construction technique, RJMLT uses a technique perturbation strategy that keeps the position in primary sample space fixed and only attempts to transition to a different sampling technique. That is, given the current state $\hat{u} = (i, \bar{u})$ in $C_i^k$, the perturbation samples a technique index j from the distribution T(i→j) and generates the proposal $\hat{v} = (j, \bar{u})$ in $C_j^k$. The distribution T(i→j) is left unspecified, but for simplicity it may be assumed to be symmetric T(i→j)=T(j→i). It should be understood that such a perturbation may be modeled as a jump between subspaces, in which case the proposal may be generated from the current state by a deterministic mapping $h_{ij}: \mathcal{U}^k \to \mathcal{U}^k$ that relates points from one space to the other; that is, $\hat{v} = (j, h_{ij}(\bar{u}))$. In one embodiment, this mapping is trivial with $h_{ij}(\bar{u}) = \bar{u}$ and an identity Jacobian. It should be understood that such a trivial mapping differs from the acceptance probability for proposals in the traditional Reversible Jump MCMC (RJMCMC) technique, where the acceptance probability for proposals is $$r(\hat{u} \to \hat{v}) = \frac{C_j(h_{ij}(\overline{u}))T(j \to i)}{C_i(\overline{u})T(i \to j)}|J[h_{ji}](\overline{u})|, \quad (5)$$

where $J[h_{ij}]$ is the Jacobian matrix of $h_{ij}$ to account for density of the mapping.

As only the sampling technique is changed and not the random number vector, the probability should only depend on the ratio of MIS weight, i.e., on how well the proposed technique samples the current path compared to the current sampling technique. However, if the RJMCMC acceptance probability of equation (5) is used, then it would yield:

$$r(\hat{u} \to \hat{v}) = \frac{C_j(\overline{u})}{C_i(\overline{u})}|\mathbb{I}| \quad (6)$$

$$= \frac{w_j(\overline{u})C(S_j(\overline{u}))}{w_i(\overline{u})C(S_i(\overline{u}))}, \quad (7)$$

where $\mathbb{I}$ is the identity matrix. Equation (7) shows the main problem of such a naïve perturbation: even though the random number vector has not changed, the proposed state uses a different mapping to transform the vector into a light path. In general, $S_i(\overline{u}) \neq S_j(\overline{u})$, and it is likely that the proposed path (and therefore $C_j(S_j(\overline{u}))$) differs from the current path by a significant amount, as shown in panels C-D of FIG. 1 discussed above. Such large changes are unlikely to be accepted, which impedes the Markov Chain's ability to transition between different sampling techniques. MMLT additionally couples the technique changes with perturbations of u, but this does not address the problem of low acceptance rates whenever a proposal changes path construction techniques.

In one embodiment, a perturbation of sampling techniques leaves the current path unchanged when switching techniques, as shown in panels E-F of FIG. 1. As shown, the rendering application may perform a technique perturbation by finding a new point 150 in the primary sample space $\overline{v}$ such that $S_j(\overline{v})=S_i(\overline{u})$, and jump to such a point $\overline{v}$ as part of the perturbation. Assuming that the sampling techniques are diffeomorphisms, i.e., all $S_i$ are smooth and possess a smooth inverse, then the technique perturbation may employ the mapping $h_{ij}(\overline{u})=S_j^{-1}(S_i(\overline{u}))$ to obtain the point 150, where $S_j^{-1}$ is an inverse sampling technique that transforms a light path into a random number vector that would produce the light path. The Jacobian of such a mapping is $$|J[h_{ij}](\overline{u})| = |J[S_j^{-1} \circ S_i](\overline{u})| \quad (8)$$

$$= |J[S_j^{-1}](S_i(\overline{u}))||J[S_i](\overline{u})| \quad (9)$$

$$= |J[S_j](\overline{v})|^{-1}|J[S_i](\overline{u})|, \quad (10)$$

where the last step (10) follows from the inverse function theorem and allows the Jacobian of the mapping to be re-written in terms of Jacobians of the sampling techniques $S_i$ and $S_j$. It should be understood that the Jacobian of a sampling technique is related to its PDF. In particular, if $S_i(\overline{u})$ is a diffeomorphism, then $|J[S_i](\overline{u})|=p_i(\overline{u})^{-1}$. The acceptance probability (i.e., the probability of accepting a perturbed technique proposal) is then $$r(\hat{u} \to \hat{v}) = \frac{T(j \to i)C_j(\overline{v})p_j(\overline{v})}{T(i \to j)C_i(\overline{u})p_i(\overline{u})} \quad (11)$$

$$= \frac{T(j \to i)w_j(\overline{v})f_j(\overline{v})p_j(\overline{v})^{-1}p_j(\overline{v})}{T(i \to j)w_i(\overline{u})f_i(\overline{u})p_i(\overline{u})^{-1}p_i(\overline{u})} \quad (12)$$

$$= \frac{T(j \to i)w_j(\overline{v})f(S_j(\overline{v}))}{T(i \to j)w_i(\overline{u})f(S_i(\overline{u}))} \quad (13)$$

$$= \frac{T(j \to i)w_j(\overline{v})}{T(i \to j)w_i(\overline{u})}, \quad (14)$$

where the last cancellation can be obtained with $S_i(\overline{u})=S_j(\overline{v})$, which holds by construction. Equation (14) has several interesting properties. First, this acceptance ratio only depends on the relative MIS weight of the proposed and the current techniques, which allows the Markov Chain to easily transition to the optimal sampling techniques as the path space is explored. Second, the path contribution function does not appear in the acceptance ratio of equation (14), and expensive retracing of paths is not required. As a result, the remaining terms in the acceptance ratio may be derived from the current state before generating the proposal, allowing the rendering application to select an optimal proposal distribution with $T(i \to j)=w_j(\overline{u})$. Doing so cancels all remaining terms in equation (14) and gives an acceptance ratio of 1, i.e., the proposed technique perturbation is always accepted. Such a technique perturbation that is always accepted is also referred to herein as a reversible jump.

Figure 2:
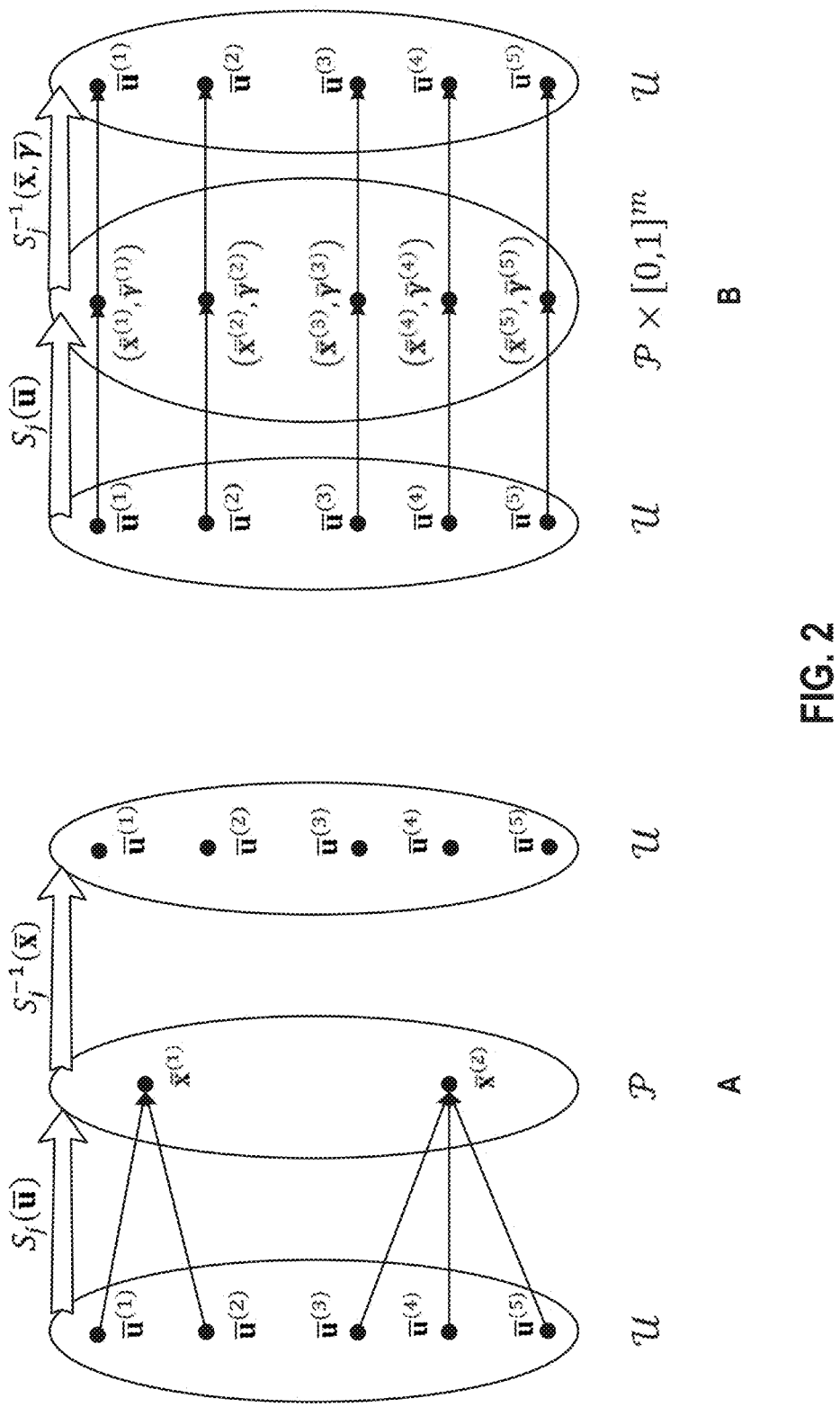
FIG. 2 illustrates an approach for inverting non-injective mappings, according to an embodiment.

Although discussed above with respect to diffeomorphisms that are smooth and possess a smooth inverse, some sampling techniques may not be injective and may map several random number vectors to the same path, which can introduce ambiguities when attempting to compute inverses. FIG. 2 illustrates an example of such a non-injective mapping and an approach for inverting the non-injective mapping, according to an embodiment. As shown in panel A, a mapping $S_j(\overline{u})$ 210 takes both points $\overline{u}^{(1)}$ and $\overline{u}^{(2)}$ in the primary sample space $\mathcal{U}$ to path $\overline{x}^{(1)}$ and all three of points $\overline{u}^{(3)}$, $\overline{u}^{(4)}$, and $\overline{u}^{(5)}$ to path $\overline{x}^{(2)}$. However, the inverse mapping $S_j^{-1}(\overline{x})$ 220 from the path space back to the primary sample space then has ambiguities, as, e.g., $\overline{x}^{(1)}$ could be mapped back to either $\overline{u}^{(1)}$ or $\overline{u}^{(2)}$.

As shown in panel B, one embodiment sidesteps this issue by ensuring all mappings are bijective. In particular, the path space may be extended by parameterizing its points by an additional parameter $\overline{\gamma}$ produced by the mapping $S_i(\overline{u})$ 230. That is, the path space is extended with auxiliary dimensions such that no information about the random number vectors are lost during sampling, thereby allowing paths to be inverted. In addition, the rendering application may use probabilistic inverses as a practical solution to non-invertibility and reason about such probabilistic inverses within the RJMCMC framework. Suppose that the set of all random number vectors that map to a path $\overline{x}$ is given by $\mathcal{M}_{\overline{x}} = \{\overline{u}|S_j(\overline{u})=\overline{x}\}$. Then, the inverse mapping $S_j^{-1}$ 240 may be augmented with the additional parameter $\overline{\gamma} \in [0,1]^m$ that disambiguates the inverse so that each pair of inputs $S_j^{-1}(\overline{x}, \overline{\gamma})$ maps to a single entry of $\mathcal{M}_{\overline{x}}$. Here, the role of $\overline{\gamma}$ is to encode the "extra" dimensions in $\overline{u}$ that do not directly sample the path, and such a map permits reversible jumps with the following modifications: sampling techniques generate points on an extended path space $\mathcal{P} \times [0,1]^m$, and $S_i(\overline{u})$ computes the pair $(\overline{x}, \overline{\gamma})$, where $\overline{x}$ is the sampled path and $\overline{\gamma}$ is the auxiliary input that would produce $\overline{u}$ when used in the inverse mapping $S_j^{-1}(\overline{x}, \overline{\gamma})$. Using such an extended path space, information is not lost when transitioning from or to primary sample space, enabling the use of RJMCMC to derive the acceptance probability $$r(\hat{u} \to \hat{v}) = \frac{C_j(\overline{v})T(j \to i)|J[S_i](\overline{u})|}{C_i(\overline{u})T(i \to j)|J[S_j](\overline{v})|}, \quad (15)$$

$$= \frac{C_j(\overline{v})T(j \to i)|J[S_i^{-1}](\overline{x}, \overline{\gamma})|^{-1}}{C_i(\overline{u})T(j \to i)|J[S_j^{-1}](\overline{y}, \overline{\gamma})|^{-1}}, \quad (16)$$

$$= \frac{C_j(\overline{v})T(j \to i)|J[S_i^{-1}](\overline{y}, \overline{\gamma})|}{C_i(\overline{u})T(i \to j)|J[S_j^{-1}](\overline{x}, \overline{\gamma})|}, \quad (17)$$

where the step from equations (15) to (16) follows from the inverse function theorem. This construction permits non-invertible mappings to be supported.

In one embodiment, the rendering application may resolve ambiguities during path sampling by randomly selecting an inverse when multiple inverses are available. In practice, such random selection of an inverse may be realized by combining technique change perturbations with an additional step, discussed in greater detail below with respect to FIG. 4, that samples $\overline{\gamma} \in [0,1]^m$ from a uniform distribution. This modification to the proposal results in extra unit factors in the acceptance probability that cancel such that the acceptance probability of the probabilistic inverse is given by equation (17). It should be understood that the auxiliary vector $\overline{\gamma}$ that is re-sampled as part of every technique perturbation is no longer part of the Markov Chain's state.

Aside from non-injective mappings such as those shown in FIG. 2, another problematic case involves sampling techniques with overlapping support (not shown), such as a diffuse specular BRDF that samples either a diffuse or a specular lobe according to a probability $\alpha_{\mathit{diffuse}}$:

$$S_{phong}(u) = \begin{cases} S_{\mathit{diffuse}}(u_2, \ldots), & \text{if } u_1 < \alpha_{\mathit{diffuse}} \\ S_{\mathit{specular}}(u_2, \ldots), & \text{otherwise} \end{cases} \quad (18)$$

It should be understood that, following an interaction with a material, most scattered directions can be sampled using two distinct vectors of uniform variates corresponding to interactions with the diffuse and specular lobes, respectively. In addition, the probability density of the sampling technique is simply the average of the diffuse and specular PDFs, i.e., $p_{phong}(u) = (p_{\mathit{diffuse}}(u) \ p_{\mathit{specular}}(u))/2$, while the Jacobian becomes discontinuous at $u_1 = \alpha_{\mathit{diffuse}}$:

$$J[S_{phong}](u) = \begin{cases} J[S_{\mathit{diffuse}}](u_2, \ldots), & \text{if } u_1 < \alpha_{\mathit{diffuse}} \\ J[S_{\mathit{specular}}](u_2, \ldots), & \text{otherwise} \end{cases} \quad (19)$$

Mixtures of sampling techniques lead to non-diffeomorphic mappings, which break the relation between the Jacobian determinant and the probability density $|J[S](u)|=p(u)^{-1}$ used in deriving the acceptance probability for the invertible case discussed above with respect to equation (14). However, the same framework for handling path sampling techniques that are not strictly invertible by randomly sampling one of the multiple possible inverses, discussed above with respect to FIG. 2, can be used to resolve the ambiguity from the mixtures of sampling techniques.

Figure 3:
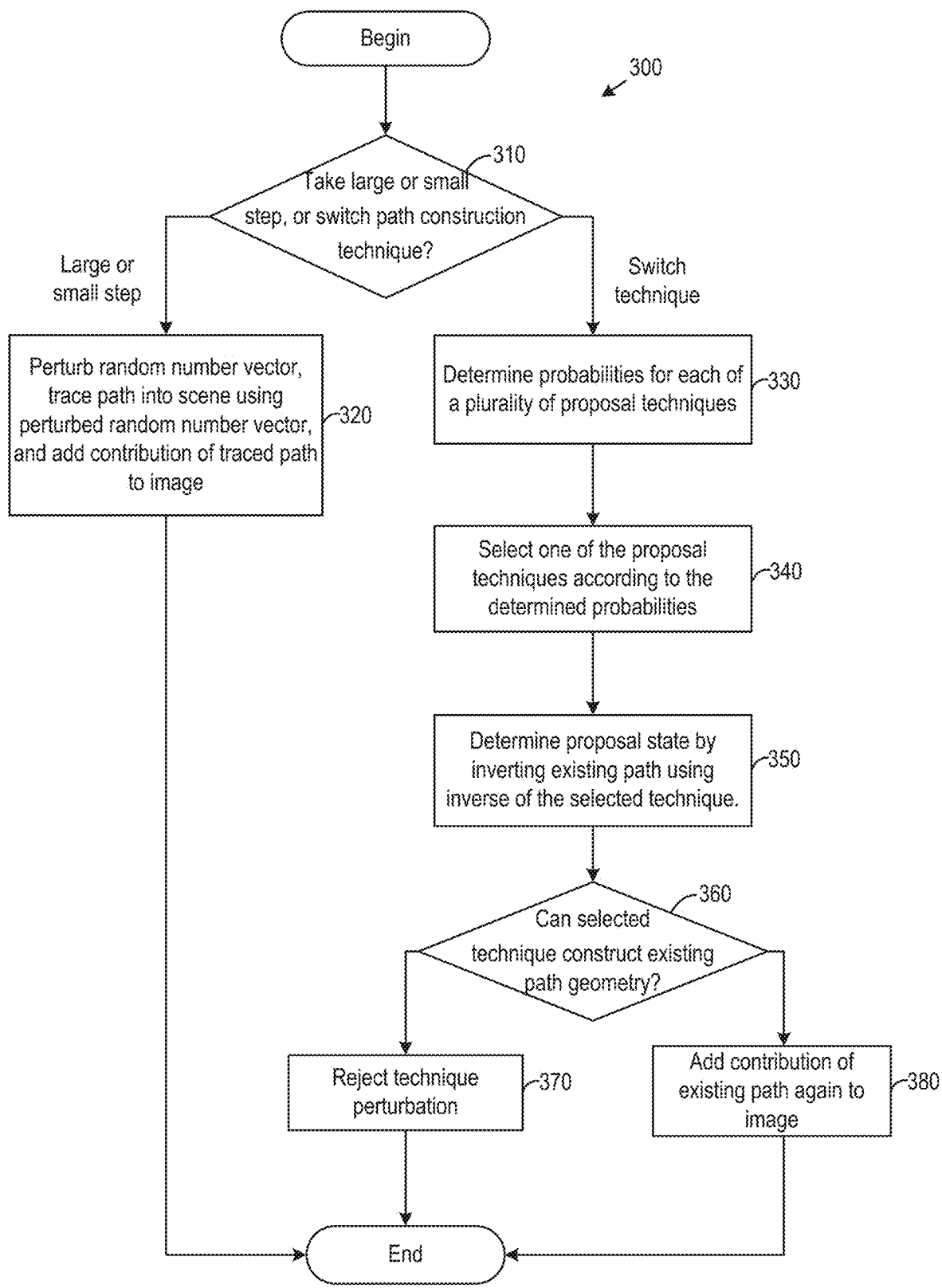
FIG. 3 illustrates a method for tracing a light path in rendering an image of a three-dimensional virtual environment, according to an embodiment.

FIG. 3 illustrates a method 300 for tracing a light path in the rendering of an image of a three-dimensional virtual environment, according to an embodiment. Although one iteration of the rendering process is shown for simplicity, it should be understood that, in general, a rendering application may iteratively perform the illustrated steps of method 300 multiple times in a random walk and combine the results to render an image.

As shown, the method 300 begins at step 310, where the rendering application determines whether to take a large step, a small step, or to switch path construction techniques. That is, the rendering application employs a Markov Chain that explores the sample space using random number perturbation as well as performs technique perturbation, with each of the samples in the chain depending on a previous sample. In one embodiment, a probabilistic decision is made on whether to perturb the random number vector with the small step, the large step (a technique change without keeping the path intact (i.e., without the reversible jump), which are needed to explore the path space), or to switch path construction techniques using a reversible jump. For example, the Markov Chain may select either the large step, the small step, or the technique change with a fixed probability distribution (e.g., 10%, 85%, and 5%, respectively), and the technique index may be explicitly separated from the rest of the primary sample space such that small step perturbations do not change the sampling technique. In another embodiment, the rendering application may also perturb the random number vector and switch techniques at the same time, which may be more efficient in some circumstances. The entire Markov Chain may also be terminated with some probability and a new Markov Chain started from scratch thereafter.

If the rendering application chooses to take a large or a small step, then at step 320, the rendering application perturbs the random number vector using any feasible technique, such as that used in traditional MMLT, traces a path into the scene using the perturbed random number vector, and adds the contribution from the traced path to the image being rendered.

If, on the other hand, the rendering application chooses to switch path construction techniques, then at step 330, the rendering application determines probabilities for each of a number of proposal techniques. In one embodiment, the rendering application may compute the MIS weight $w_i(\overline{u})$ of each of a plurality of sampling techniques $S_i(\overline{u})$ of BDPT, with such weights being used to decide a next technique to use.

At step 340, the rendering application selects one of the proposal techniques according to the determined probabilities. In the case of the MIS weights $w_i(\overline{u})$ being computed for the sampling technique $S_i(\overline{u})$ of BDPT, the rendering application may select one of those technique $S_j$ with probability, $w_j(S_j(\overline{u}))$.

At step 350, the rendering application determines a proposal state by inverting an existing path (generated during a previous iteration with another sampling technique) using an inverse of the selected technique. That is, the rendering application jumps to the proposal state $\hat{v}=(j, S_j^{-1}(S_i(\overline{u})))$, which is a sample-space vector with a different set of random numbers (from the initial random numbers) that would have produced the same path with the selected technique j. As discussed, if the selected technique is injective, then an inverse of the selected technique may be used to map the path to the proposal state. Where the selected technique is associated with ambiguous proposal state intervals or is a mixture of sampling techniques, then the rendering application may sample the interval uniformly or randomly select one of the sampling techniques according to a probability distribution, as described in greater detail below with respect to FIG. 4.

Although described herein primarily with respect to inverting an existing path, it should be understood that the rendering application may also reuse one or more elements of the previous sample-space vector corresponding to a subpath of the existing path. That is, the path construction technique perturbation may include using a chain of vertices of one path for another path. For example, the rending application may keep the first three (or some other number of) vertices of an existing path unchanged and only change (e.g., using traditional techniques) the remaining vertices of the existing path.

In rare cases, it may be impossible to invert a path due to numerical error. In one embodiment, the rendering application may detect such cases by checking if the path cannot be sampled by the method it attempts to invert (e.g., if a direction lies in the wrong hemisphere), and reject the proposals in such cases. In some other cases, the sampling technique may produce more than one sample for one set of inputs, with surplus samples being cached and reused in future sample queries, introducing a dependence between paths. Given only a single sample, it may be unclear how to invert such a scheme and the correct acceptance ratio, and the rendering application may reject technique perturbations involving such sampling techniques.

At step 360, the rendering application determines whether the selected technique can construct existing path geometry. It should be understood that, as the geometry of the new path constructed by the existing technique is identical to the existing path geometry, there is no need to actually trace the path again (of course, the path could also be traced again). Instead, the rendering application may simply determine whether the selected technique is able to construct the already existing path geometry. In one embodiment, the rendering application may make such a determination by ensuring that the selected technique's sampling routine can sample all the vertices of the existing path probabilistically. For example, in a scene with a point light (i.e., an infinitesimal point that emits light), a path tracing technique that starts from the camera may never be able to "find" this point probabilistically, so such a techniques may be unable to create a strategy that samples the point explicitly (e.g. by starting a path from it). By ensuring that the selected technique's sampling routine can sample all the vertices of the existing path probabilistically, the rendering application may identify such a case where the path tracing technique is unable to sample the point light explicitly.

If the selected technique cannot construct the existing path geometry, then the rendering application rejects the technique perturbation at step 370. If, on the other hand, the selected technique can construct the existing path geometry, then at step 380, the rendering application adds, to the image being rendered, the contribution of the existing path again. As discussed, the only change is effectively the path construction technique (and the contribution of the "second" path as it depends on the strategy), while path geometry remains unchanged. As a result, the identical path does not need to be traced into the scene again to simulate effects of the light interacting with virtual objects in the scene. Instead, data from a previous simulation with the same light path (and a different path construction technique) may be used again as another contribution to the image. That is, either a contribution of a new sample is added, via step 320, or the contribution of an existing path is added again at step 380.

It should further be understood that samples that are not used (directly) increase the contribution of other samples indirectly.

Figure 4:
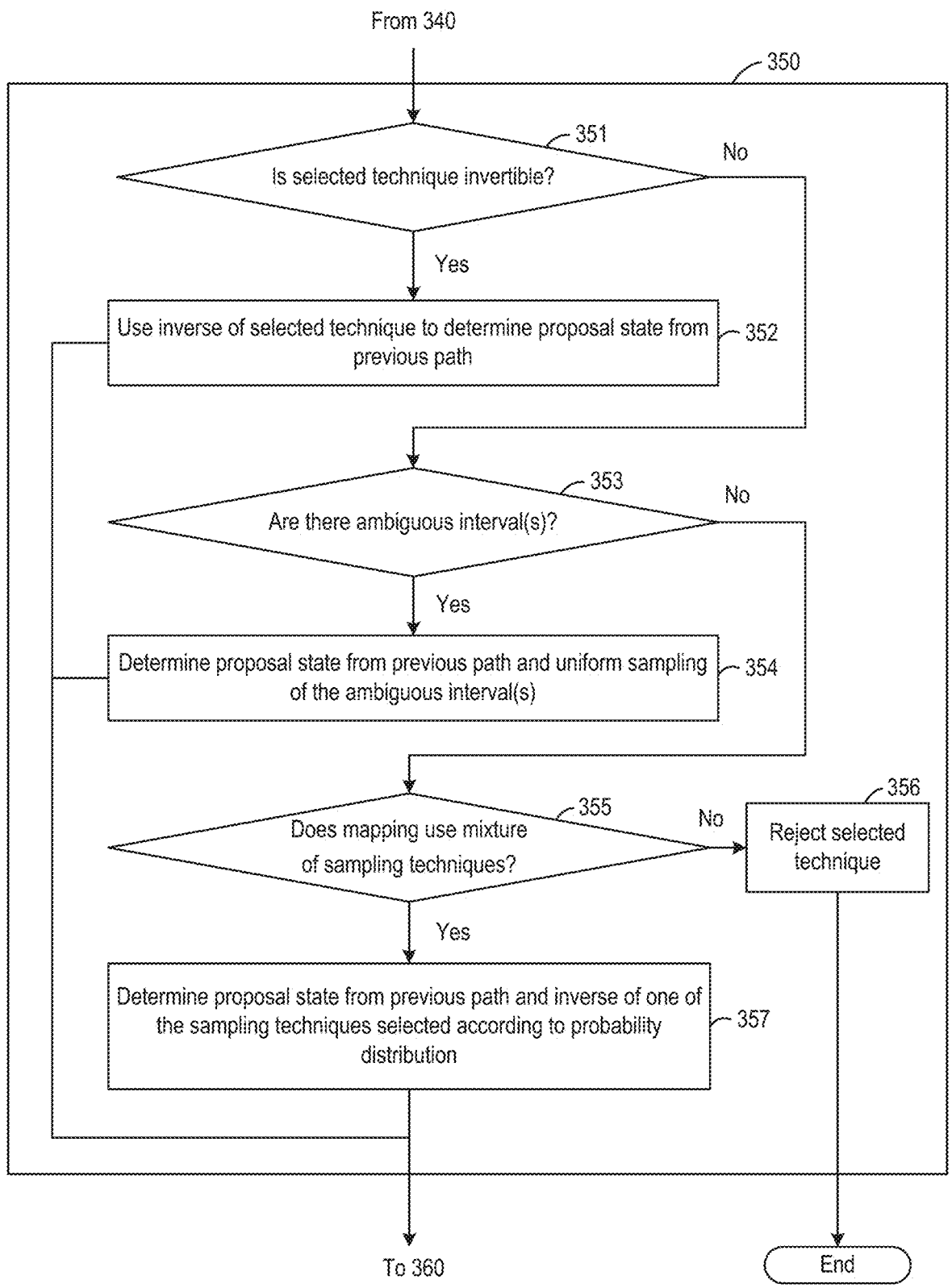
FIG. 4 illustrates in greater detail the inverting step of the method shown in FIG. 3, according to an embodiment.

FIG. 4 illustrates in greater detail the inversion step 350 of the method 300, according to an embodiment. As shown, at step 351, the rendering application determines whether the technique selected at step 340 is invertible. If the selected technique is invertible, then, at step 352, the rendering application uses an inverse of the selected technique to determine a proposal state from the previous path. It should be understood that, in practice, light paths are sampled incrementally in a random walk. This corresponds to chaining a series of q low-dimensional sampling techniques, which can be written as $$S_i(\bar{u}) = (g_1(u_1), g_2(x_1, u_2), \ldots, g_q(x_{q-1}, u_q)), \quad (20)$$

where $\bar{x} = x_1 \ldots x_l$ is the path up to vertex $x_l$, and $g_l(x_{l-1}, u_l)$ is the l-th sampling technique along the path, using a subset of the random numbers in random number vector $\bar{u}$. Inverting $S_i$ then reduces to inverting the individual techniques $g_l$, in an analogous "inverse random walk." The Jacobian determinant required by equation (17) turns into a product of determinants for each step, i.e., $$|J[S_j^{-1}](\bar{x}, \bar{\gamma})| = \Pi_{l=1}^q |J[g_l^{-1}](x_l, \gamma_l)|.$$

In order to maintain an optimal acceptance ratio and for equation (14) to hold, the individual Jacobians $|J[g_l^{-1}](\bar{x}_l, \gamma_l)|$ should be equal to the PDF of the corresponding mapping $g_l$. The following discussion focuses on a single sampling technique g and subscripts are dropped for ease of notation.

Mappings based on the inversion method form the basic building blocks of many sampling techniques and are handled easily. Such techniques draw samples from a probability distribution p by mapping uniform variates through the inverse cumulative distribution function (CDF) $p^{-1}$. These mappings are invertible by construction, and to support them one embodiment requires an additional implementation of the CDF P, which serves as a (non-probabilistic) inverse. That is, for many importance schemes used in graphics, the inverse sampling function is simply the CDF P. The Jacobian determinant $|J[g^{-1}](x, \gamma)|$ of this inverse is equal to the probability density function (PDF) p of the sampling technique.

At the core of technique perturbation is the inverse bidirectional sample function $S_j^{-1}(\bar{x})$, which may be written in terms of two invocations of an inverse random walk, described above. In this form, a single technique change requires inverting the entirety of the current path back to primary sample space, which is an expensive operation for long paths. In one embodiment, this operation may be optimized by reusing some of the current state u. It should be understood that during a technique change, one of the subpaths of the proposal state may be truncated compared to the current state, while the other subpath is extended. During this process, |j−i| vertices are removed from one subpath and added to the other, which on average is much smaller than k+1, the total number of vertices of the path. As the elements of the current state used to sample each subpath are known, the rendering application may simply copy the elements of u corresponding to the vertices of the truncated subpath, which are left unchanged. Doing so can save one inverse random walk. Where it is possible to invert only part of a path, the rendering application may also reuse all of the elements of u that correspond to the extended subpath, and merely append the random numbers corresponding to the vertices that were added to the extended subpath. During a technique change, this permits a full path inversion to be achieved by processing only |j−i| vertices rather than k+1.

If the selected technique is not invertible, then at step 353, the rendering application determines if there are ambiguous intervals for elements of proposal $\bar{v}$, such as those caused by the non-injective mapping discussed above with respect to FIG. 2 are ambiguous intervals for elements of proposal $\bar{v}$, such as those caused by the non-injective mapping discussed above with respect to FIG. 2. For example, ambiguous intervals may arise whenever a dimension $u_i$ in primary sample space could take on any value on an interval [a, b] without changing the generated path.

If there are ambiguous intervals for elements of the proposal $\bar{v}$, then at step 354, the rendering application determines a proposal state from the previous path and a uniform sampling of the ambiguous intervals. Returning to the example of the ambiguous intervals arising from the dimension $u_i$ in primary sample space that could take on any value on the interval [a, b], a probabilistic inverse may be constructed (and then applied to invert the previous path) by generating a uniform variate $\gamma \in [0,1]$ and set $u_i = g^{-1}(\gamma)$, where $$g^{-1}(\gamma)=a+\gamma\cdot(b-a) \text{ and } J[g^{-1}](\gamma)=b-a. \quad (21)$$

For entirely unused dimensions of primary sample space, this reduces to $g^{-1}(\gamma)=\gamma$ with a unit Jacobian determinant. That is, the rendering application uniformly re-samples unused dimensions during the inversion and does not influence the acceptance probability.

At step 355, the rendering application determines if the mapping $S_j$ uses a mixture of sampling techniques. For example, the mapping may be the diffuse specular BRDF, discussed above, that samples either a diffuse or a specular lobe according to a probability. More generally, it may be assumed that sampling technique g is made up of a combination of sampling techniques $g_1, \ldots, g_n$ selected at random, where technique $g_i$ is chosen with probability $\alpha_i$ and the technique index t is chosen by the primary sample $u_1$ such that $\alpha_1 + \ldots + \alpha_{t-1} \le u_1 < \alpha_1 + \ldots + \alpha_t$.

If the mapping uses a mixture of sampling techniques, then at step 356, the rendering application determines a proposal state from the previous path and an inverse of one of the sampling techniques selected according to a probability distribution. Returning to the example of the sampling technique g that is made up of a combination of sampling techniques $g_1, \ldots, g_n$ selected at random, the rendering application may first randomly select a technique index t from a discrete distribution T(t). The rendering application may then invert the sample assuming that it was generating using the t-th technique. Doing so disambiguates both which interval $u_1$ falls into as well as which mapping $g_t^{-1}$ should be used. For a fixed t, the resulting inverse and Jacobian determinant are then $$g^{-1}(x,\gamma)=(\alpha_1+\ldots+\alpha_{t-1}+\gamma_1\cdot\alpha_t, g_t^{-1}(x,\gamma_2\ldots)), \quad (22)$$

$$|J[g^{-1}](\bar{x},\bar{\gamma})|=\alpha_t\cdot|J[g_t^{-1}](\bar{x},\gamma_2\ldots)|. \quad (23)$$

The technique index t extends the proposal state generated by RJMLT. In addition to selecting the j-th technique of BDPT as MMLT does, the rendering application also selects which of the n sampling techniques should be used to invert g, which yields a slightly modified acceptance probability $$r((\hat{u}, t_{\hat{u}}) \to (\hat{v}, t_{\hat{v}})) = r((\hat{u} \to \hat{v})\frac{T(t_{\hat{u}})}{T(t_{\hat{v}})}. \quad (24)$$

It should be understood that any probability distribution T that samples technique t with nonzero probability may be used if the probability distribution can potentially produce x. In one embodiment, the rendering application may use the probability distribution $$T(t) = \frac{\alpha_t \cdot |J[g_t^{-1}](\bar{x}, \bar{\gamma})|}{\sum_{s=1}^{n} \alpha_s |J[g_s^{-1}](\bar{x}, \bar{\gamma})|}, \quad (25)$$

which cancels out the Jacobian in equation (23) in the acceptance ratio and results in an acceptance rate of 1.

Otherwise, at step 357, the rendering application rejects the selected technique. Such a rejection may occur where, e.g., it is impossible to invert a path due to numerical error or where the sampling technique produces more than one sample for one set of inputs and it is unclear how to invert such a scheme and the correct acceptance ratio, as described above. If the selected technique is rejected, then method 300 ends thereafter.

Figure 5:
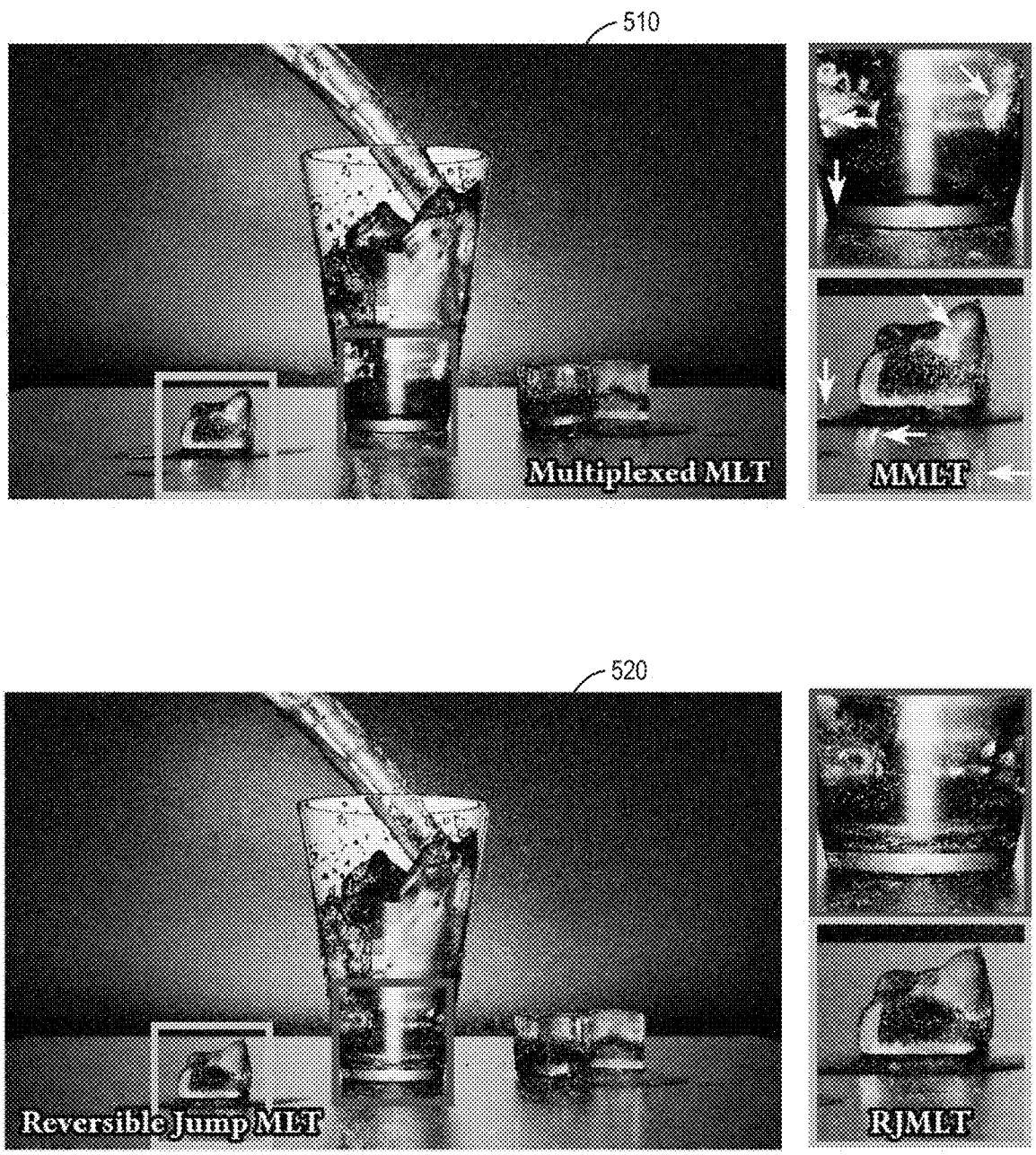
FIG. 5 illustrates a comparison between an example image rendered using Multiplexed Metropolis Light Transport and an example image rendered according to an embodiment.

FIG. 5 illustrates a comparison between an image 510 rendered using MMLT and an image 520 rendered using an embodiment of the techniques disclosed herein. Experience has shown that images rendered using techniques disclosed herein that employ reversible jumps (e.g., the image 520) exhibit more stable and visually pleasing noise behavior across runs than images rendered using MMLT, in some cases significantly so. In particular, as techniques disclosed herein are able to transition between sampling techniques easily, the resulting images tend to have fewer artifacts (e.g., streaks, splotches, wrongly positioned caustics, etc.) than MMLT at equal render time. Such artifacts are symptomatic of the Markov Chain "getting stuck" and exploring a small part of the path space for too long.

Figure 6:
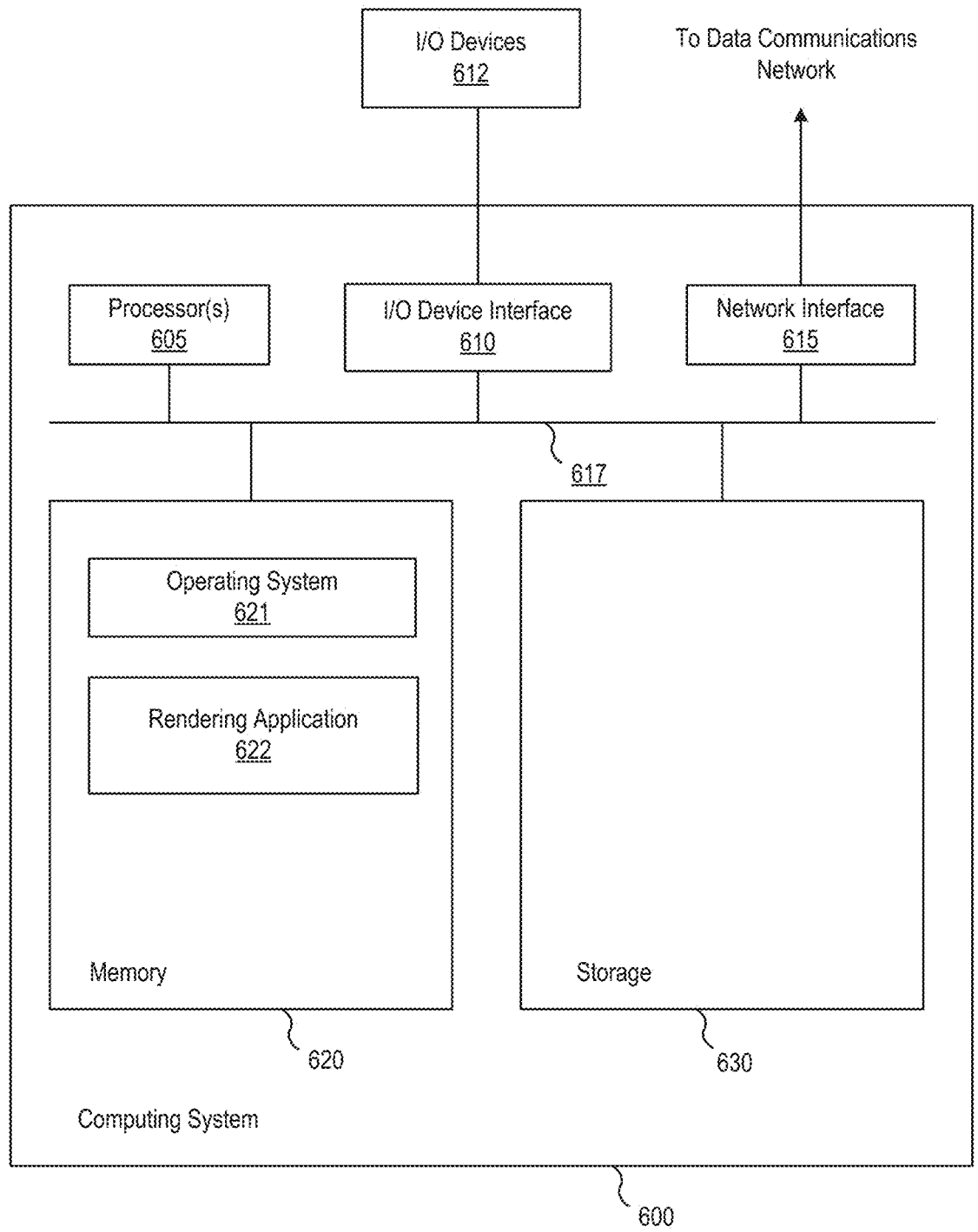
FIG. 6 illustrates a system in which an aspect of this disclosure may be implemented.

FIG. 6 illustrates a system 600 in which an embodiment of this disclosure may be implemented. As shown, the system 600 includes, without limitation, processor(s) 605, a network interface 615 connecting the system to a network, an interconnect 617, a memory 620, and storage 630. The system 600 may also include an I/O device interface 610 connecting I/O devices 612 (e.g., keyboard, display and mouse devices) to the system 600.

The processor(s) 605 generally retrieve and execute programming instructions stored in the memory 620. Similarly, the processor(s) 605 may store and retrieve application data residing in the memory 620. The interconnect 617 facilitates transmission, such as of programming instructions and application data, between the processor(s) 605, I/O device interface 610, storage 630, network interface 615, and memory 620. The processor(s) 605 are included to be representative of general purpose processor(s) and optional special purpose processors for processing video data, audio data, or other types of data. For example, the processor(s) 605 may include a single central processing unit (CPU), multiple CPUs, a single CPU having multiple processing cores, one or more graphical processing units (GPUS), one or more FPGA cards, or a combination of these. And the memory 620 is generally included to be representative of a random access memory. The storage 630 may be a disk drive storage device. Although shown as a single unit, the storage 630 may be a combination of fixed or removable storage devices, such as magnetic disk drives, flash drives, removable memory cards or optical storage, network attached storage (NAS), or a storage area-network (SAN). Further, the system 600 is included to be representative of a physical computing system as well as virtual machine instances hosted on a set of underlying physical computing systems. Further still, although shown as a single computing system, one of ordinary skill in the art will recognized that the components of the system 600 shown in FIG. 6 may be distributed across multiple computing systems connected by a data communications network.

As shown, the memory 620 includes an operating system 621 and a rendering application 622. The operating system 621 may be, e.g., Linux®. The rendering application 622 is configured to render 3D virtual environments using reversible jumps. In one embodiment, the rendering application 622 may, for each of a number of steps, determine whether to take a large step, a small step, or to switch path construction techniques; perturb a random number vector if a large step or small step is being taken; and if the path construction technique is being switched: determine probabilities for each of a number of proposal techniques; select one of the proposal techniques according to the determined probabilities; determine a proposal state by inverting a path using an inverse of the selected technique; determine whether the selected technique can construct existing path geometry; if the selected technique cannot construct the existing path geometry, reject the technique perturbation; and if the selected technique can construct the existing path geometry, add, to the image being rendered, the contribution of the existing path again, according to the method 300 discussed above with respect to FIGS. 3-4.

Advantageously, embodiments disclosed herein provide an approach for perturbing path construction techniques while maintain the same path geometry. Leaving the path geometry intact may reduce variance (noise) in the rendered image to improve efficiency and produce higher-quality image(s), such as individual images or the image frames of a movie. Embodiments disclosed herein also accept technique perturbations with essentially 100% probability across all path lengths, in contrast to traditional techniques such as MMLT.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order or out of order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A computer-implemented method for rendering an image of a virtual scene, the method comprising:

generating a first path sample using a first path construction technique and a first sample-space vector;

probabilistically selecting a second path construction technique from a plurality of path construction techniques;

generating a second path sample, wherein generating the second path sample includes determining, using an inverse of the second path construction technique, a second sample-space vector corresponding to the first path sample, wherein the inverse of the second path construction technique is a probabilistic inverse that selects an inverse of one of a plurality of path construction techniques in a mixture of path construction techniques based on a probability distribution; and adding a contribution of the second path sample to the image of the virtual scene.

2. The method of claim 1, wherein the inverse of the second path construction technique is a probabilistic inverse that uniformly samples one or more ranges of possible values.

3. The method of claim 1, wherein the inverse of the second path construction technique is selected according to the probability distribution of form $$T(t) = \frac{\alpha_t \cdot |J[g_t^{-1}](\hat{x}, \hat{y})|}{\sum_{s=1}^{n} \alpha_s |J[g_s^{-1}](\hat{x}, \hat{y})|}.$$

4. The method of claim 1, further comprising, confirming that the second path construction technique is able to construct the first path sample.

5. The method of claim 1, wherein the second path construction technique is selected based on weights assigned to the plurality of path construction techniques.

6. The method of claim 1, wherein each of the plurality of path construction techniques is a distinct bidirectional path sampling technique.

7. The method of claim 1, further comprising, generating a third path sample using the second path construction technique and a third sample-space vector.

8. The method of claim 1, wherein the second sample-space vector is further determined based, at least in part, on a random number perturbation.

9. The method of claim 1, wherein a path geometry of the first path sample is identical to a path geometry of the second path sample.

10. A non-transitory computer-readable storage medium storing a program, which, when executed by a processor performs operations for rendering an image of a virtual scene, the operations comprising a plurality of steps, and at least one of the plurality of steps includes:

generating a first path sample using a first path construction technique and a first sample-space vector;

probabilistically selecting a second path construction technique from a plurality of path construction techniques;

generating a second path sample, wherein generating the second path sample includes determining, using an inverse of the second path construction technique, a second sample-space vector corresponding to the first path sample, and reusing one or more elements of the first sample-space vector corresponding to a subpath of the first path sample which does not change; and adding a contribution of the second path sample to the image of the virtual scene.

11. The computer-readable storage medium of claim 10, wherein the inverse of the second path construction technique is a probabilistic inverse that uniformly samples one or more ranges of possible values.

12. The computer-readable storage medium of claim 10, wherein the inverse of the second path construction technique is a probabilistic inverse that selects an inverse of one of a plurality of path construction techniques in a mixture of path construction techniques based on a probability distribution.

13. The computer-readable storage medium of claim 12, wherein the inverse of the second path construction technique is selected according to the probability distribution of form $$T(t) = \frac{\alpha_t \cdot |J[g_t^{-1}](\hat{x}, \hat{y})|}{\sum_{s=1}^{n} \alpha_s |J[g_s^{-1}](\hat{x}, \hat{y})|}.$$

14. The computer-readable storage medium of claim 10, the operations further comprising, confirming that the second path construction technique is able to construct the first path sample.

15. The computer-readable storage medium of claim 10, wherein each of the plurality of path construction techniques is a distinct bidirectional path sampling technique.

16. The computer-readable storage medium of claim 10, wherein the second sample-space vector is further determined based, at least in part, on a random number perturbation.

17. The computer-readable storage medium of claim 10, wherein a path geometry of the first path sample is identical to a path geometry of the second path sample.

18. A system, comprising:
a processor; and
a memory, wherein the memory includes an application program configured to perform operations for rendering an image of a virtual scene, the operations comprising a plurality of steps, and at least one of the plurality of steps includes:
generating a first path sample using a first path construction technique and a first sample-space vector,
probabilistically selecting a second path construction technique from a plurality of path construction techniques,
generating a second path sample, wherein generating the second path sample includes determining, using a left or full inverse of the second path construction technique, a second sample-space vector corresponding to the first path sample, and
adding a contribution of the second path sample to the image of the virtual scene.

\* \* \* \* \*

UNITED STATES PATENT AND TRADEMARK OFFICE
CERTIFICATE OF CORRECTION

PATENT NO. : 10,580,194 B2
APPLICATION NO. : 15/808658
DATED : March 3, 2020
INVENTOR(S) : Jan Novak et al.

It is certified that error appears in the above-identified patent and that said Letters Patent is hereby corrected as shown below:

On the Title Page

On the page 2, in Column 1, under "Publications", Line 18, delete "effcient" and insert -- efficient --, therefor.

On the page 2, in Column 1, under "Publications", Line 26, delete "451{ 458." and insert -- 451-458. --, therefor.

On the page 2, in Column 1, under "Publications", Line 31, delete "J.-S." and insert -- J. S. --, therefor.

On the page 2, in Column 1, under "Publications", Line 36, delete "Confer-ence" and insert -- Conference --, therefor.

On the page 2, in Column 1, under "Publications", Line 46, delete "Ren-dering," and insert -- Rendering, --, therefor.

On the page 2, in Column 2, under "Publications", Line 41, delete "Megakemels" and insert -- Megakernels --, therefor.

On the page 2, in Column 2, under "Publications", Line 55, delete "UK, UK," and insert -- UK, --, therefor.

On the page 2, in Column 2, under "Publications", Line 70, delete "Lyon/Universit" and insert -- Lyon/Université --, therefor.

On the page 2, in Column 2, under "Publications", Line 71, delete "1/Universit Lumire" and insert -- 1/Université Lumière --, therefor.

On the page 2, in Column 2, under "Publications", Line 71, delete "2/cole" and insert -- 2/École --, therefor.

Signed and Sealed this
Twenty-eighth Day of July, 2020

Andrei Iancu
*Director of the United States Patent and Trademark Office*

CERTIFICATE OF CORRECTION (continued)

On the page 3, in Column 1, under "Publications", Line 2, delete "EurographicsWorkshop" and insert -- Eurographics Workshop --, therefor.

On the page 3, in Column 1, under "Publications", Line 3, delete "UK, UK," and insert -- UK, --, therefor.

On the page 3, in Column 1, under "Publications", Line 15, delete "23(6)343-349," and insert -- 23(6):343-349, --, therefor.

On the page 3, in Column 1, under "Publications", Line 39, delete "https://doi.org/10. 1145/" and insert -- https://doi.org/10.1145/ --, therefor.

On the page 3, in Column 2, under "Publications", Line 8, delete "Onlly]." and insert -- Only]. --, therefor.

In the Specification

In Column 1, Line 12, delete "nonphotorealistic" and insert -- non-photorealistic --, therefor.

In Column 6, Line 64, delete "$I_j = \int_{\mathcal{P}} h_j(\overline{x}) f(\overline{x}) d\mu(\overline{x}).$" and insert -- $I_j = \int_{\mathcal{P}} h_j(\overline{\mathbf{x}}) f(\overline{\mathbf{x}}) d\mu(\overline{\mathbf{x}}).$ --, therefor.

In Column 9, Lines 1-2, delete "$r(\hat{u} \to \hat{v}) = \frac{C_j(h_{ij}(\overline{u}))T(j \to i)}{C_i(\overline{u})T(i \to j)} |J[h_{ji}](\overline{u})|,$" and insert -- $r(\hat{\mathbf{u}} \to \hat{\mathbf{v}}) = \frac{C_j(h_{ij}(\overline{\mathbf{u}}))T(j \to i)}{C_i(\overline{\mathbf{u}})T(i \to j)} |J[h_{ij}](\overline{\mathbf{u}})|,$ --, therefor.

In Column 9, Line 35, delete "u," and insert -- ū, --, therefor.

In Column 10, Line 48, delete "$S_i(\bar{u})$" and insert -- $S_j(\bar{u})$ --, therefor.

In Column 11, Lines 9-10, delete "$= \frac{C_j(\overline{v})T(j \to i)|J[S_j^{-1}](\overline{x}, \overline{y})|^{-1}}{C_i(\overline{u})T(j \to i)|J[S_j^{-1}](\overline{y}, \overline{y})|^{-1}},$" and insert

CERTIFICATE OF CORRECTION (continued)
U.S. Pat. No. 10,580,194 B2

$$= \frac{C_j(\mathbf{v})T(j \to i)\left|J\left[S_i^{-1}\right](\mathbf{x},\overline{\gamma})\right|^{-1}}{C_i(\mathbf{u})T(i \to j)\left|J\left[S_j^{-1}\right](\mathbf{y},\overline{\gamma})\right|^{-1}},$$

--, therefor.

In Column 11, Line 50, delete "$p_{phong}(u)=(p_{diffuse}(u)\ p_{specular}(u))/2$," and insert -- $p_{phong}(u)=(p_{diffuse}(u)+p_{specular}(u))/2$, --, therefor.

In Column 14, Line 28, delete "$\left|J\left[g_l^{-1}\right](\overline{\mathbf{x}}_l,\gamma_l)\right|$" and insert -- $\left|J\left[g_l^{-1}\right](\mathbf{x}_l,\gamma_l)\right|$ --, therefor.

In Column 15, Line 56, delete "$\left|J\left[g^{-1}\right](\overline{\mathbf{x}},\overline{\gamma})\right|=\alpha_t\cdot\left|J\left[g_t^{-1}\right](\overline{\mathbf{x}},\gamma_2\ldots)\right|.$" and insert -- $\left|J[g^{-1}](\overline{\mathbf{x}},\overline{\gamma})\right| = \alpha_t \cdot \left|J[g_t^{-1}](\overline{\mathbf{x}},\gamma_2\ldots)\right|.$ --, therefor.